United States Patent
Vu et al.

(10) Patent No.: US 9,209,137 B2
(45) Date of Patent: Dec. 8, 2015

(54) MULTIPLE SEAL-RING STRUCTURE FOR THE DESIGN, FABRICATION, AND PACKAGING OF INTEGRATED CIRCUITS

(71) Applicant: Avago Technologies General IP (Singapore) PTE, LTD, Singapore (SG)

(72) Inventors: Duc Anh Vu, San Jose, CA (US); Jayalakshmana Kumar Pragasam, Milpitas, CA (US); Vijay Meduri, Saratoga, CA (US); Seyed Attaran, San Ramon, CA (US); Michael J. Grubisich, San Jose, CA (US); Syed Ahmed, Pleasanton, CA (US); Aniket Singh, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/333,348

(22) Filed: Jul. 16, 2014

(65) Prior Publication Data
US 2014/0327115 A1 Nov. 6, 2014

Related U.S. Application Data

(62) Division of application No. 13/566,332, filed on Aug. 3, 2012, now Pat. No. 8,785,246.

(51) Int. Cl.
*H01L 21/78* (2006.01)
*H01L 23/544* (2006.01)
*G06F 17/50* (2006.01)
*H01L 23/10* (2006.01)

(52) U.S. Cl.
CPC .......... *H01L 23/544* (2013.01); *G06F 17/5072* (2013.01); *H01L 21/78* (2013.01); *H01L 23/10* (2013.01); *H01L 2924/0002* (2013.01)

(58) Field of Classification Search
CPC ..... H01L 21/78; H01L 23/562; H01L 23/544; H01L 23/10; H01L 2223/5446; H01L 2224/94; H01L 2223/54493; H01L 2251/566; H01L 24/94
See application file for complete search history.

(56) References Cited

U.S. PATENT DOCUMENTS

| | | | |
|---|---|---|---|
| 2010/0072578 A1* | 3/2010 | Kunishima | 257/620 |
| 2010/0078769 A1* | 4/2010 | West et al. | 257/620 |
| 2010/0308464 A1* | 12/2010 | Tsutsue et al. | 257/758 |

\* cited by examiner

*Primary Examiner* — Minh-Loan Tran
*Assistant Examiner* — Leslie Pilar Cruz

(57) ABSTRACT

A semiconductor circuit design includes an outer seal-ring and an inner seal-ring for each sub-section of the design that may potentially be cut into separate die. The use of multiple seal-rings permits a single circuit design and fabrication run to be used to support flexibly packaging different product releases having different numbers of integrated circuit blocks per packaged unit.

8 Claims, 7 Drawing Sheets

MULTIPLE SEAL-RING STRUCTURE FOR THE DESIGN, FABRICATION, AND PACKAGING OF INTEGRATED CIRCUITS

CROSS REFERENCE TO RELATED APPLICATIONS

This application is a divisional of co-pending U.S. patent application Ser. No. 13/566,332, filed on Aug. 3, 2012, and entitled "MULTIPLE SEAL-RING STRUCTURE FOR THE DESIGN, FABRICATION, AND PACKAGING OF INTEGRATED CIRCUITS," which is incorporated herein by reference in its entirety for all purposes.

FIELD OF THE INVENTION

The present invention is generally directed towards the design and use of seal-rings in an integrated circuit. More particularly, the present invention is directed to the design and use of a seal-ring for a semiconductor device capable of being packaged with a variable number of integrated circuits.

BACKGROUND OF THE INVENTION

There are many applications in which it is desirable to include more than one processing unit in a packaged integrated circuit device in order to increase processing power. This is often performed by replicating the same processor unit across the silicon wafer to achieve a fixed number of processors per packaged device. For example, an integrated circuit may include one microprocessor core, two microprocessor cores, three microprocessor cores, etc.

A problem in the prior art is that it is often more expensive than desired to provide customers with choices in the amount of processing power of packaged devices. For example, consider the situation that an integrated circuit may be designed with anywhere between one to six processing units. Conventionally, each design choice would require the generation of a separate electronic design file that is used to fabricate each design choice in a manner consistent with conventional die cutting and packaging techniques. This includes various design rules to safely and reliably cut and package individual die from a wafer. For example, a design having one processing unit per die conventionally requires a first electronic design file to fabricate a die having one processing unit. In order to fabricate a design having six processing units in accordance with conventional design rules, the electronic design file must be modified to fabricate an individual die having six processing units.

Thus, a problem faced in the prior art is that it is more expensive than desired to provide customers with options in regards to the number of processing units per packaged device.

SUMMARY OF THE INVENTION

A multiple seal-ring structure is disclosed for the design, fabrication, and packaging of integrated circuits. The wafer includes a set of integrated circuit blocks. A fabricated wafer includes an outer seal-ring to permit the entire wafer to be packaged as a unit. Inner seal rings permit the wafer to be cut and packaged as sub-units. In one implementation, each integrated circuit block corresponding to a smallest potential die size, has its own inner seal ring. In an exemplary method, the circuit design for wafer-level processing is provided to a foundry for fabrication. The fabricated wafer may then be flexibly packaged with different numbers of integrated circuit blocks per unit, depending on whether a die cutting process is used to separate the fabricated wafer.

DETAILED DESCRIPTION

Figure 1:
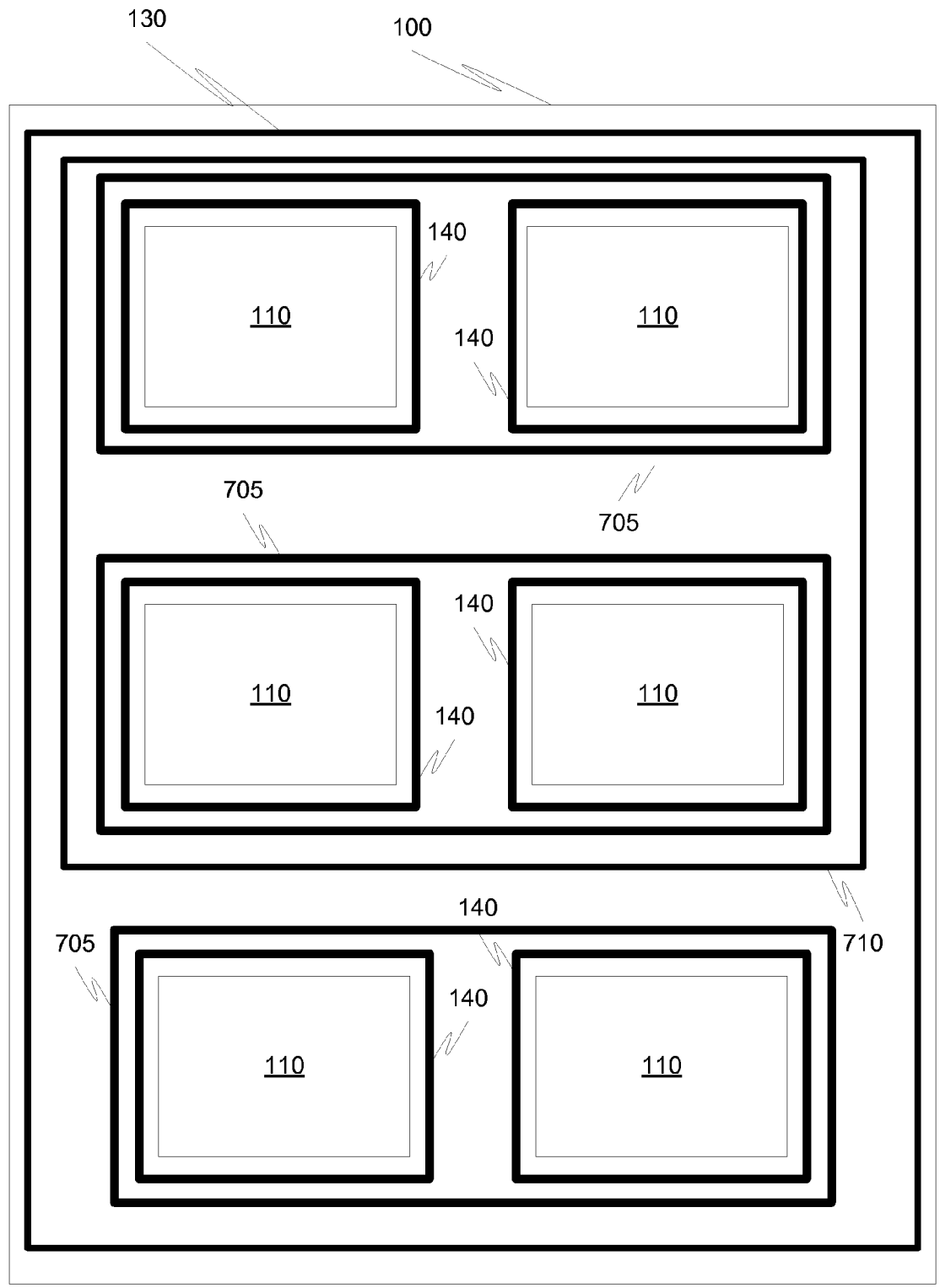
FIG. 1 illustrates a wafer design having an outer seal-ring and inner seal-rings in accordance with one embodiment of the present invention.

FIG. 1 illustrates a wafer 100 fabricated from a wafer-level fabrication process. The wafer 100 has multiple integrated circuit blocks (IC blocks) 110 residing on the wafer in accordance with one embodiment of the present invention. Each IC block 110 is an integrated circuit that includes at least one processor, and is designed to be used either individually, or in parallel, with one or more other IC blocks 110 for increased processing power.

The wafer 100 requires sufficient mechanical strength to support a die separation process, such as a cutting process. The IC blocks 110 may, for example, be fabricated directly into wafer 100 using conventional semiconductor manufacturing techniques. As an illustrative example, a CMOS fabrication process may be used. However, more generally, any process to directly or indirectly form multiple IC blocks 110 on a wafer may be used.

The entire wafer has an outer seal-ring 130 disposed about the periphery of the wafer. Additionally, in one implementation, each individual IC block 110 also has its own individual seal-ring 140. In one embodiment, each potential subunit that is a packaging option, has a seal-ring encompassing all of the IC blocks within the subunit. In one embodiment, there is an additional seal-ring about subunits of more than one IC block 110, such as an additional seal-ring 705 about each subunit of two IC blocks. Additionally, in one embodiment, a seal-ring 710 is placed about a subunit having four IC blocks.

Each seal-ring 130, 140, 705, and 710 is formed using the same integrated circuit fabrication process. Thus, the same multiple mask layers used to fabricate outer seal-ring 130 are also used to simultaneously fabricate inner seal-rings 140, 705, and 710. Generally speaking, a seal-ring (also sometimes referred to as a "guard ring") is a component to improve product reliability. A seal-ring structure is used to avoid introducing die-sawing stress and contaminants into the circuits of a chip. A seal-ring is typically formed about all of the circuits of a chip to protect a packaged chip during the packaging process and during subsequent use. A seal-ring is formed from multiple metal layers of the integrated circuit process that are patterned and aligned to form a continuous seal-ring that blocks contaminants from entering the active electronics of a chip.

The use of individual inner seal-rings 140, 705, and 710, in addition to the outer seal-ring 130, permits flexible packaging options in which the wafer 100 is cut into subunits (individual dice) that are individually packaged, and in which each packaged subunit has at least one seal ring to protect the packaged subunit. Each IC block 110 is spaced apart from adjacent IC blocks by a sufficient distance between individual seal-rings 140 to permit die separation (e.g., cutting). Additionally, in a particular fabrication run, an optional selection can be made whether to include inter-connect metal signal lines between IC blocks 110. A complex IC typically includes many mask layers. Minor variations in processing of a comparatively small number of mask layers during fabrication permits the same basic wafer design to be packaged in different ways with different options regarding internal signal interconnections between IC blocks 110. When signal interconnections are provided between IC blocks, it will be understood that the inner seal-rings have metal layers removed in selected locations to permit interior metal signal inter-connect lines to cross between IC blocks 110 (without shorting), while retaining at least one intact seal-ring about the periphery of each subunit(s) that is to be packaged. That is, the seal-ring about the periphery of a subunit that is packaged has a complete set of all metal layers necessary to shield interior components of the subunit.

Figure 2:
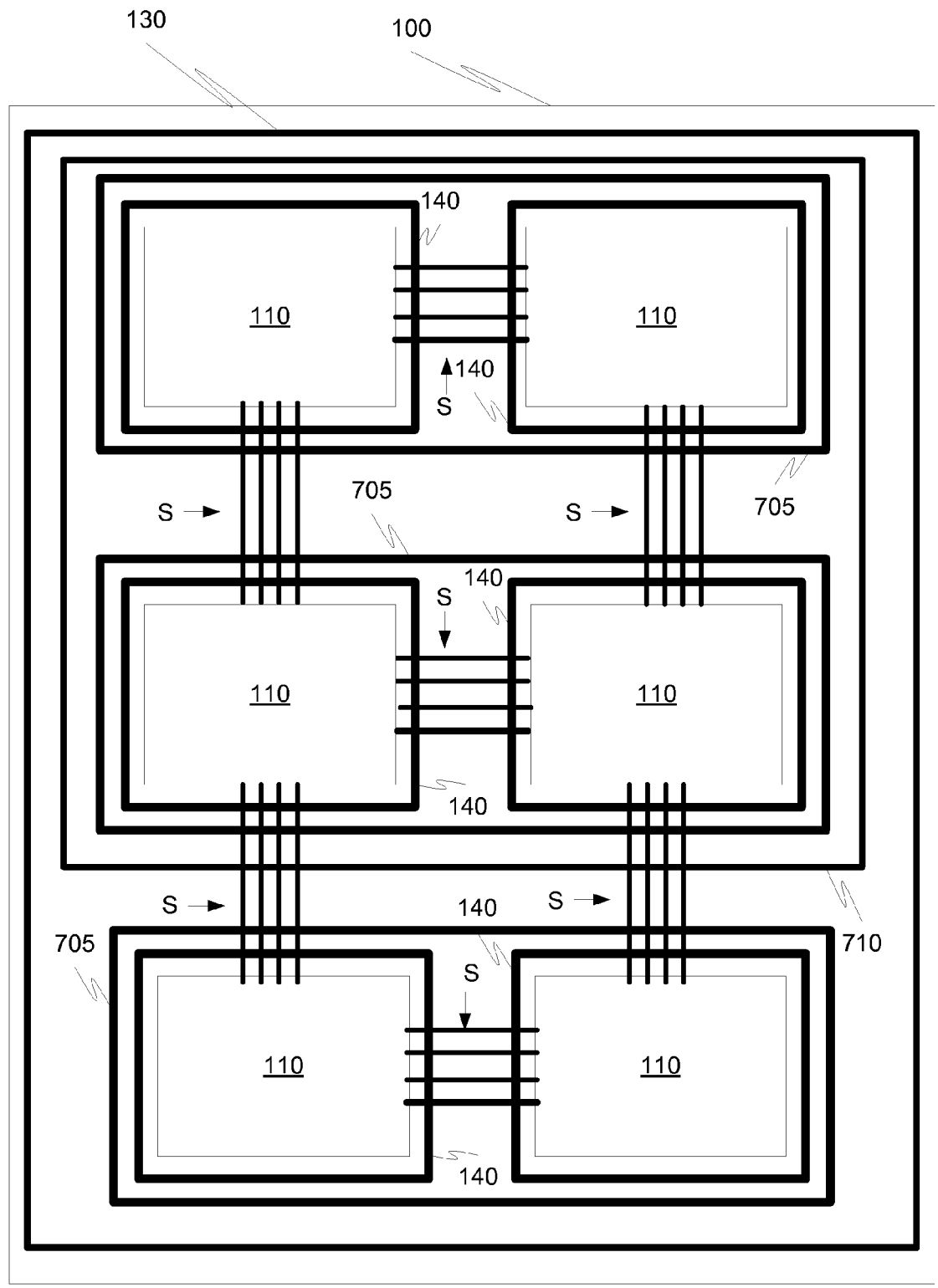
FIG. 2 illustrates a first cutting and packaging option for the wafer design of FIG. 1.

Thus, referring to FIG. 2, the entire wafer may be packaged as a single super-processing unit. Inter-connect metal lines provide signal connections, S, between individual IC blocks 110. The outer seal-ring 130 has a full set of metal layers and protects all of the integrated circuit blocks and inner inter-connect metal lines in the chip. The inner-seal rings 140, 705, and 710 have their metal layers adapted to accommodate the crossing of inter-connect metal lines and have some layers removed in at least selected regions sufficient to allow the inter-connect metal lines to cross between IC blocks 110.

Figure 3:
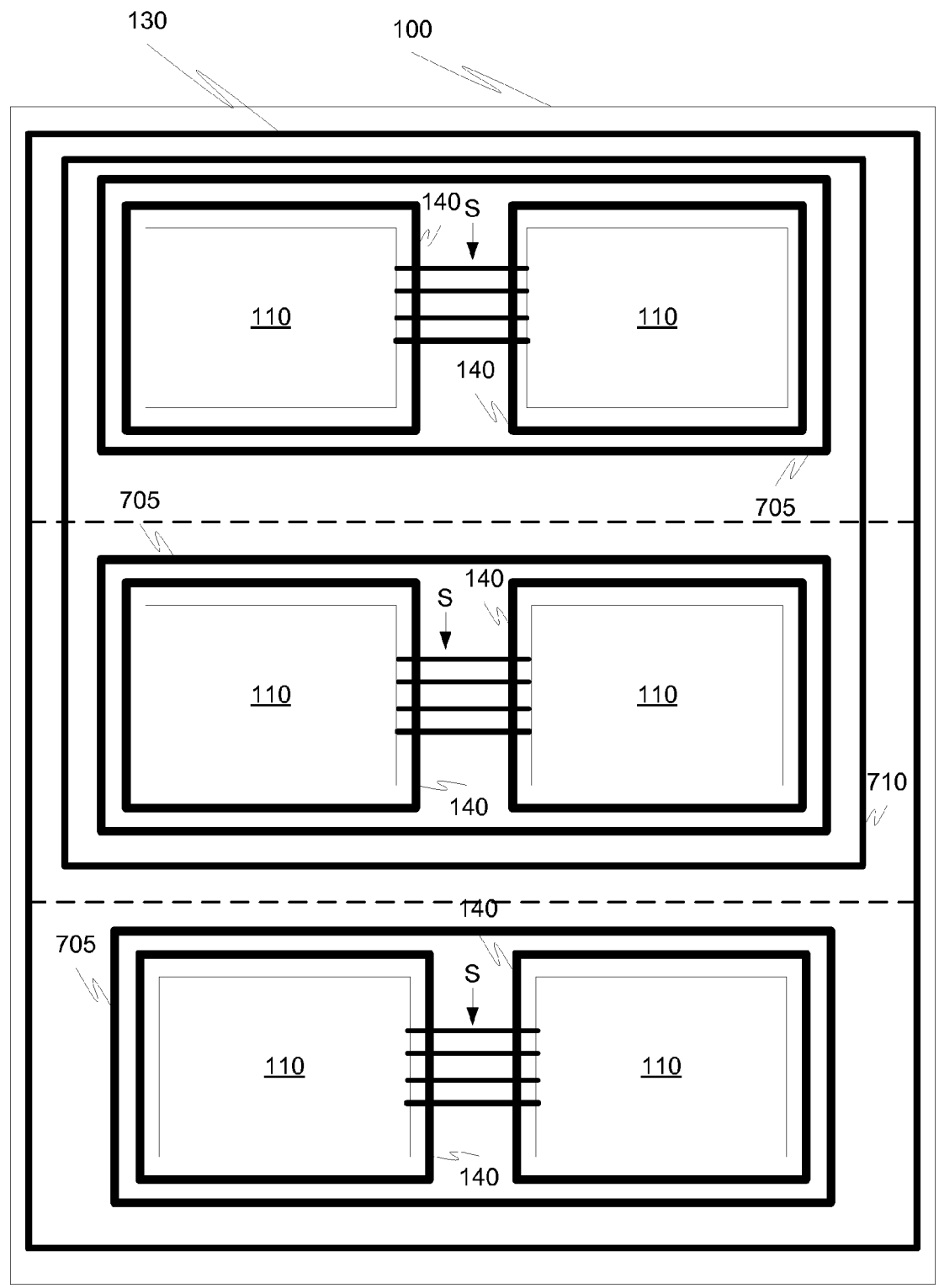
FIG. 3 illustrates a second cutting and packaging option for the wafer design of FIG. 1.

In the example of FIG. 3, inter-connect metal lines are formed between subunits of two IC blocks 110. Cutting lines are illustrated in phantom (dashed lines) to illustrate that the wafer could be cut horizontally into a set of three chips, where each chip has two IC blocks 110 that are individually protected by respective individual seal-rings 705 (with full metal layers). The inner-seal rings 140 have their metal layers adapted to accommodate inter-connect metal lines and have metal layers removed in at least some key regions to allow the inter-connect metal lines to cross.

Figure 4:
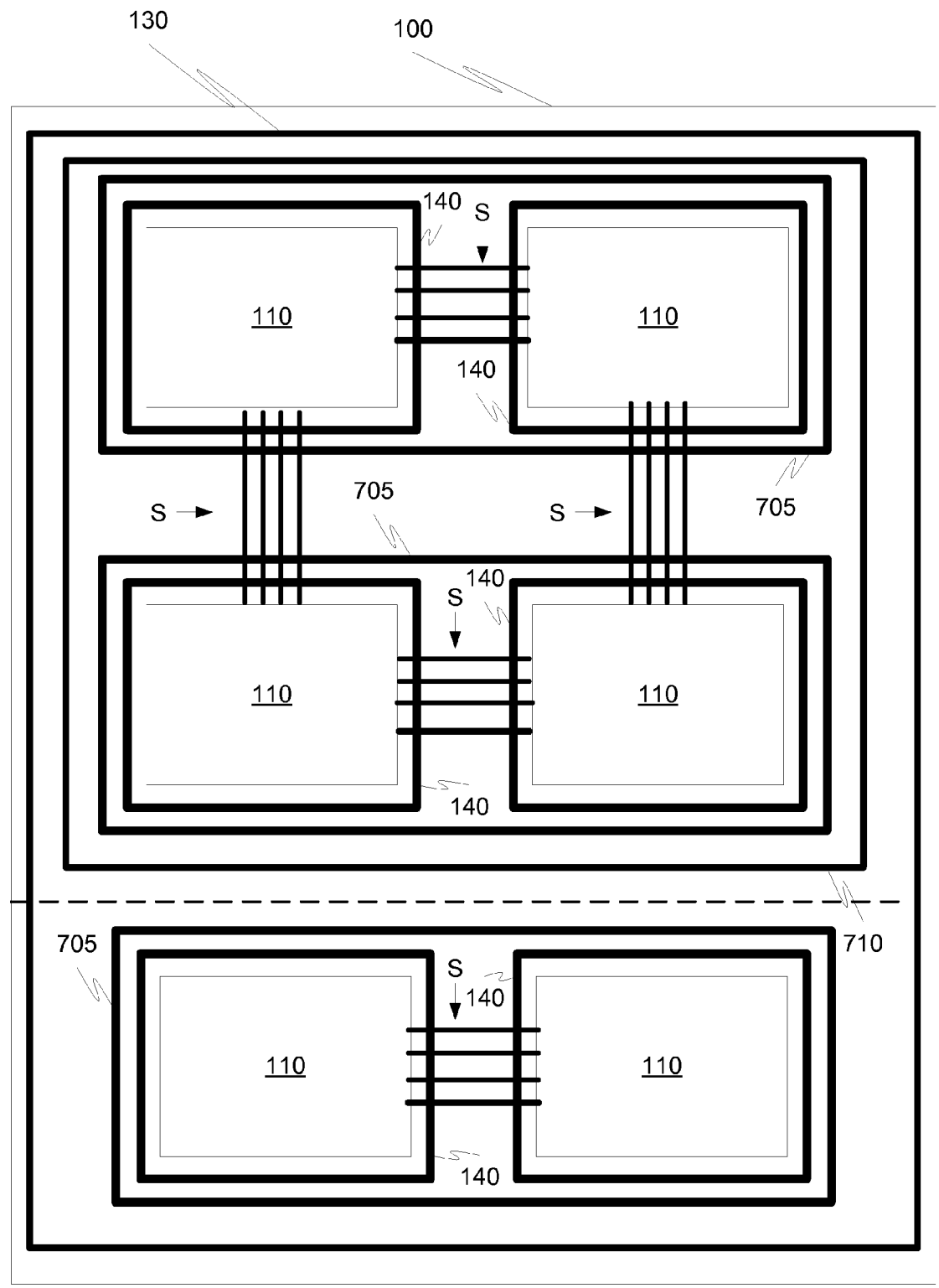
FIG. 4 illustrates a third cutting and packaging option for the wafer design of FIG. 1.

In the example of FIG. 4, a cutting line is illustrated in phantom to illustrate that the wafer could be split into two chips. The inter-connection metal lines are formed to permit the wafer 100 to be split into a first subunit having four IC blocks protected by seal-ring 710 (with full metal layers) and a second subunit having two IC blocks 110 protected by a seal-ring 705 (with full metal layers). As in other example, inner seal-rings within a subunit have selected layers removed to permit metal inter-connects to cross between IC blocks.

Figure 5:
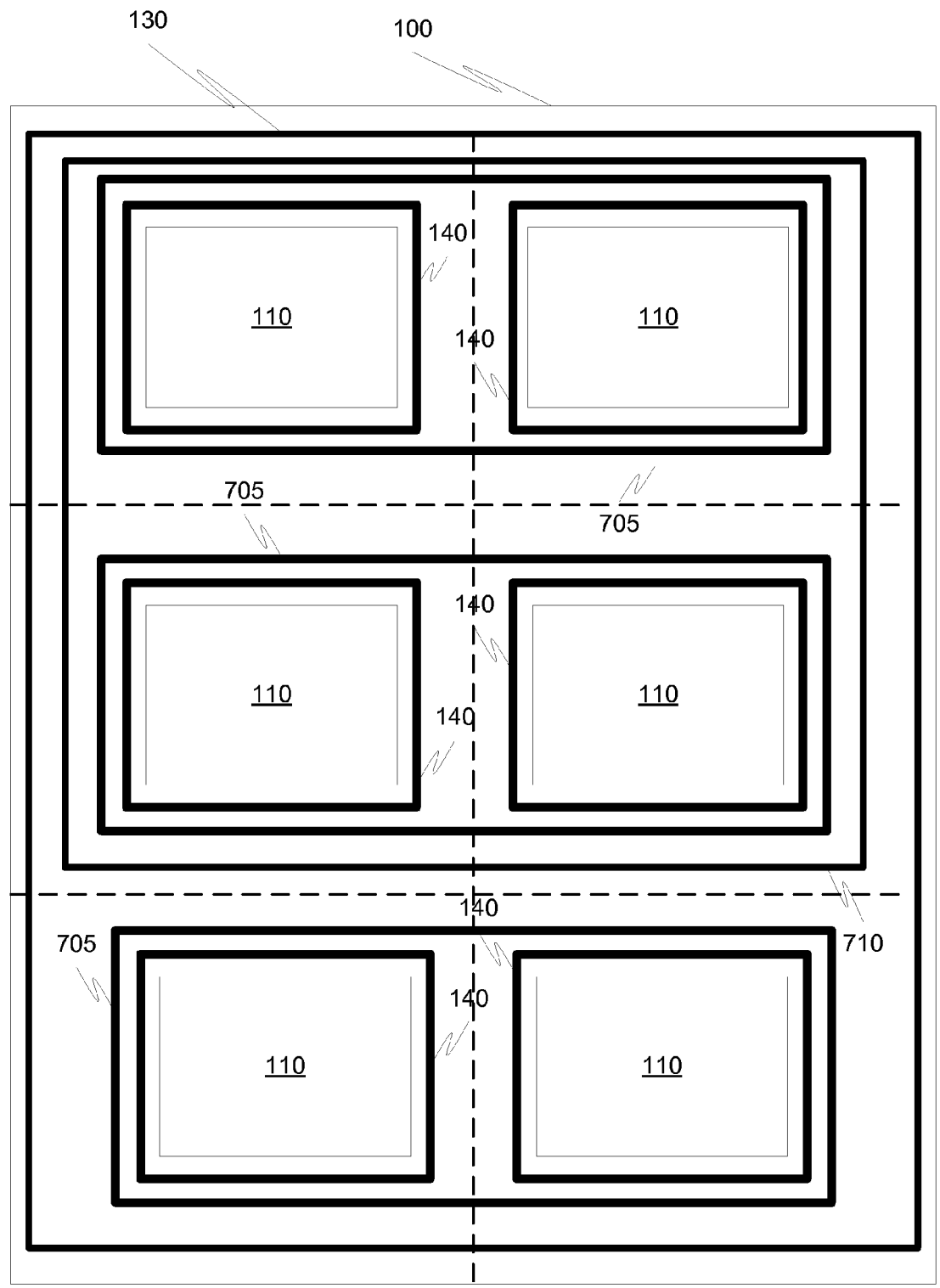
FIG. 5 illustrates a fourth cutting and packaging option for the wafer design of FIG. 1.

As illustrated by the dashed horizontal and vertical lines of FIG. 5, the metal inter-connects can be omitted. This permits cutting in both the horizontal and vertical directions, thus permitting chips having individual IC blocks 110 to be formed where each IC block 110 has an individual seal-ring 140. In this example, each individual seal-ring 140 has a complete set of metal layers to form a seal about an individual IC block 110.

The number of IC blocks 110 per wafer, and the arrangement of inner seal-rings shown in FIG. 1, are illustrative. One of ordinary skill in the art would understand that variations in the number of IC blocks per wafer, and the inner seal-ring arrangement about potential subunits, may be varied. Consequently, it would be understood by one of ordinary skill in the art that the packaging options illustrated are exemplary and non-limiting.

Figure 6:
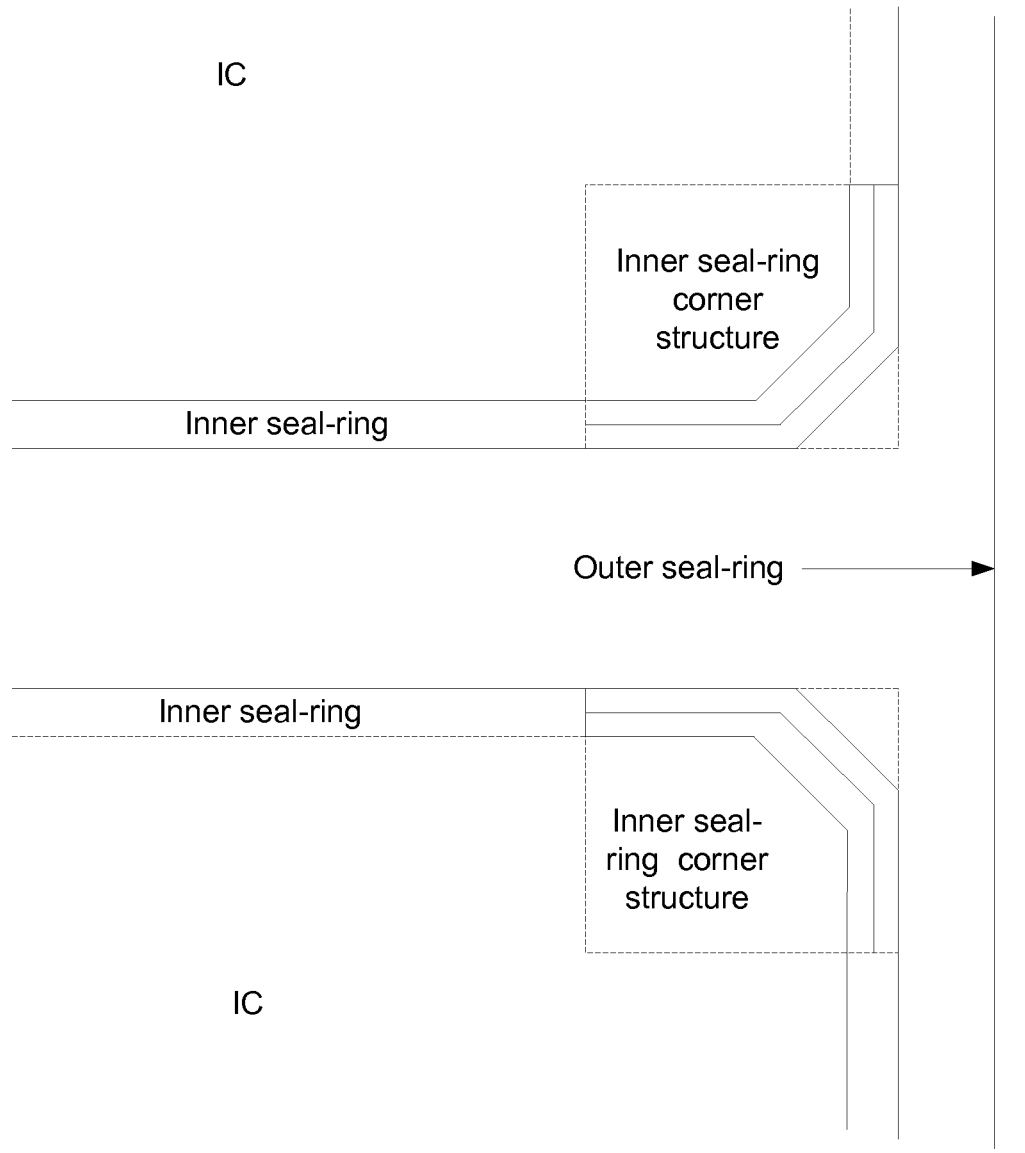
FIG. 6 illustrates aspects of inner and outer seal-ring design in accordance with one embodiment of the present invention.

FIG. 6 illustrates in more detail aspects of the inner seal-ring structure. While a seal-ring includes a continuous closed loop, it may also include corner patterns structured to minimize the chance of a failure in corner regions due to stress or other causes, when individual die are cut. This may include, for example, shaping or scalloping the corner region to avoid a sharp point and/or include stress-relieving shapes, sections, or sub-regions.

Thus, the use of multiple seal-rings permits flexible packaging options from a single run of fabricated wafers. Each possible die instance that is desired has at least one seal-ring. This permits a single manufacturing process to be used to support dies with different numbers of integrated circuit blocks to support different product releases. Additionally, the flexible packaging options also provide potential benefits to improving yield.

One application of the present invention is for complex ICs having many different mask layers, such as a system-on-a-chip IC. Conventionally, a design file, such as a Graphic Database System (GDS) file, is provided by a circuit designer to a semiconductor foundry. The foundry then implements the multiple mask layers required to fabricate the design and performs the semiconductor portion of the manufacturing. However, this can result in high development costs to make individual release masks for manufacturing. In one embodiment, a GDS file is generated that includes an outer seal-ring 120 and individual seal-rings 130, 705, and 710. The GDS file may, for example, be generated on a computer-based system, stored on a non-transitory computer readable medium, and shipped as an electronic file to a foundry. Design rules for the inner seal-ring may be automated to facilitate including inner seal-rings compatible with the same fabrication process as the outer seal-ring. Additionally, design rules may be included to provide a minimum separation distance between the individual seal-rings 140 consistent with a cutting process.

Figure 7:
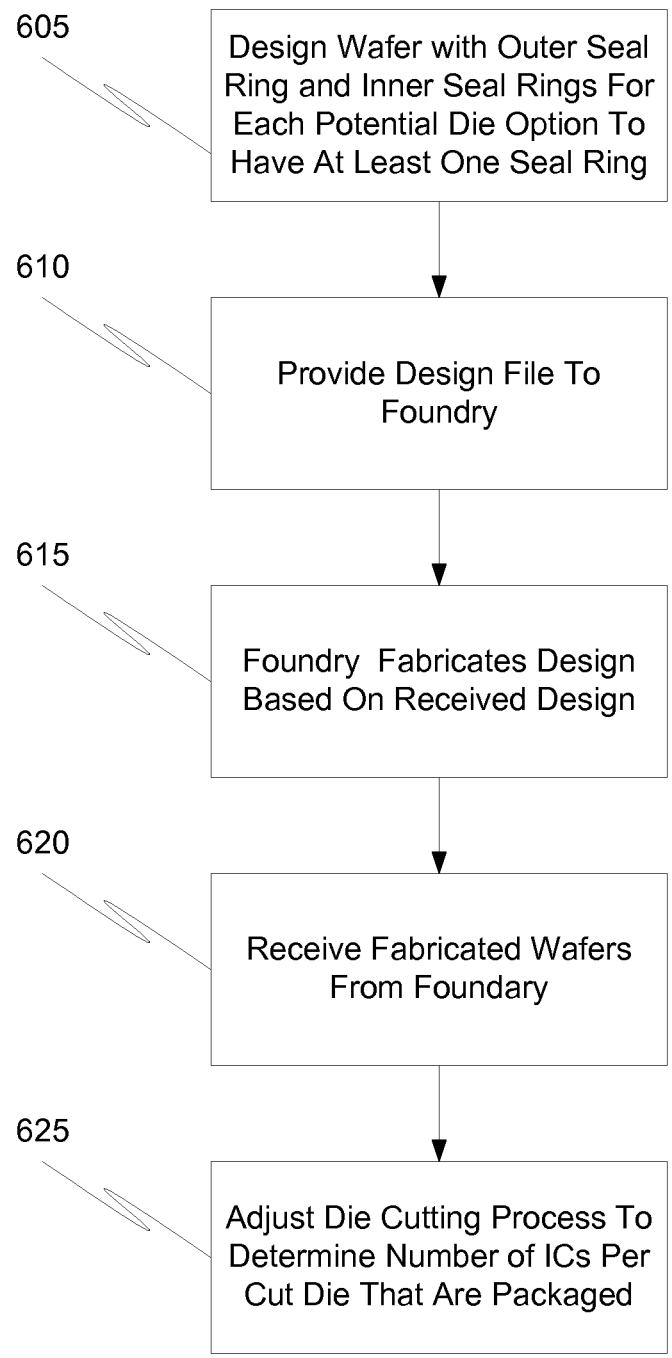
FIG. 7 is a flowchart of a method in accordance with an embodiment of the present invention.

FIG. 7 illustrates a method in accordance with one embodiment of the present invention. In step 605, a wafer is designed with an outer seal-ring and inner seal-rings, such that each potential die option has at least one seal-ring. In step 610 the design is provided to a semiconductor foundry, such as in a GDS file provided to the foundry. In step 615, the foundry fabricates the design based on the design file that it receives. The fabricated wafers are received back from the foundry in step 620. The die cutting process is then adjusted in step 625 to determine the number of IC blocks per cut die that are to be packaged as individual units. This decision may take into account the processing power required for a particular product release. Additionally, it will also be understood that the decision may take into account yield considerations based on the existence of any individual IC blocks that are non-functional due to yield issues.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. Aspects of the present invention may also be tangibly embodied as a set of computer instructions stored on a computer readable medium, such as a memory device.

What is claimed is:

1. An electronic circuit design for flexible packaging, comprising:

a plurality of integrated circuit blocks, wherein each integrated circuit block is configured to be operable as an individual integrated circuit block and in parallel with at least one other of the integrated circuit blocks;

seal-rings including an outer seal-ring and inner seal-rings, the outer seal-ring disposed about the periphery of the plurality of integrated circuit blocks and the inner seal-ring portions surrounding individual integrated circuit blocks; and the integrated circuit blocks spaced apart from each other by at least a minimum die cutting distance.

2. The electronic circuit design of claim 1, wherein there is at least one inner seal-ring surrounding each integrated circuit block.

3. The electronic circuit design of claim 2, wherein the outer seal-ring is separate and distinct from each inner seal-ring.

4. The electronic circuit design of claim 1, wherein each integrated circuit block is a system-on-a-chip.

5. An electronic circuit package, comprising:
a plurality of integrated circuit blocks;
a first seal ring surrounding a first of the integrated circuit blocks;
a second seal ring surrounding a second of the integrated circuit blocks; and
a third seal ring surrounding the first and the second integrated circuit blocks,
wherein the first and second seal rings are operable to provide the first and second integrated circuit blocks as individual circuit blocks after die cutting, and
wherein the third seal ring is operable to provide the first and second integrated circuit blocks as a single parallel circuit block after die cutting.

6. The electronic circuit package of claim 5, wherein:
the first seal ring further surrounds a third of the integrated circuit blocks.

7. The electronic circuit package of claim 5, wherein:
the seal rings are rectangularly shaped with scalloped corners.

8. The electronic circuit package of claim 5, wherein:
the first and the second integrated circuit blocks are communicatively coupled to each other via signal interconnections that cross the first and second seal rings.

* * * * *